US012805051B2

(12) United States Patent
Sanpitak et al.

(10) Patent No.: US 12,805,051 B2
(45) Date of Patent: Nov. 17, 2026

(54) INTERPOSER FOR SEMICONDUCTOR-BASED SINGLE PHOTON EMISSION COMPUTED TOMOGRAPHY DETECTOR

(71) Applicant: Siemens Medical Solutions USA, Inc., Malvern, PA (US)

(72) Inventors: Patanit Sanpitak, Highland Park, IL (US); Miesher Rodrigues, Buffalo Grove, IL (US); James Frank Caruba, Bartlett, IL (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 338 days.

(21) Appl. No.: 18/697,550

(22) PCT Filed: Dec. 1, 2021

(86) PCT No.: PCT/US2021/072652

§ 371 (c)(1),
(2) Date: Apr. 1, 2024

(87) PCT Pub. No.: WO2023/101702

PCT Pub. Date: Jun. 8, 2023

(65) Prior Publication Data

US 2024/0413186 A1 Dec. 12, 2024

(51) Int. Cl.
*H10F 39/00* (2025.01)
*G01R 31/28* (2006.01)

(52) U.S. Cl.
CPC ....... *H10F 39/811* (2025.01); *G01R 31/2889* (2013.01); *H10F 39/809* (2025.01)

(58) Field of Classification Search
CPC ....... A61B 6/037; A61B 6/4258; G01T 1/241; G01T 1/2985; G01T 1/29; H10F 39/811; H10F 39/809; G01R 31/2889
See application file for complete search history.

(56) References Cited

U.S. PATENT DOCUMENTS 6,583,635 B2 6/2003 Hembree et al.
2007/0158574 A1* 7/2007 Petrillo .................. G01T 1/244 250/370.13
2008/0001069 A1 1/2008 Perlman et al.
(Continued)

FOREIGN PATENT DOCUMENTS

CN 110687583 1/2020
JP H07282877 10/1995
(Continued)

OTHER PUBLICATIONS

International Search Report for corresponding application No. PCT/US2021/072652, dated Apr. 7, 2022.

*Primary Examiner* — Marc-Anthony Armand

(57) ABSTRACT

For testing or production of a semiconductor-based detector in SPECT, an interposer, such as elastomeric device with conductors, is sandwiched between a carrier and the semiconductor detector. The conductors allow for temporary separate connections of detector electrodes to signal processing circuitry, providing for testing of the detector operating with the signal processing circuitry. The interposer provides separate electrical connections for testing but may also be used in a final, fully integrated detector for use in a SPECT system.

19 Claims, 4 Drawing Sheets

(56) References Cited

U.S. PATENT DOCUMENTS

| | | | | |
|---|---|---|---|---|
| 2009/0000369 | A1 | 1/2009 | Sanpitak | |
| 2012/0022364 | A1 | 1/2012 | Caruba et al. | |
| 2012/0112779 | A1 | 5/2012 | Smith et al. | |
| 2012/0133001 | A1* | 5/2012 | Tkaczyk .............. | A61B 8/4483<br>438/66 |
| 2012/0133054 | A1 | 5/2012 | Tkaczyk et al. | |
| 2012/0226130 | A1 | 9/2012 | De Graff et al. | |
| 2013/0000968 | A1* | 1/2013 | Zhao ...................... | H05K 3/242<br>174/266 |
| 2013/0062525 | A1 | 3/2013 | Caruba et al. | |
| 2014/0070348 | A1* | 3/2014 | Yee ....................... | H10F 39/026<br>257/E31.127 |
| 2021/0290189 | A1 | 9/2021 | Vija et al. | |
| 2021/0290196 | A1 | 9/2021 | Rodrigues | |

FOREIGN PATENT DOCUMENTS

| | | |
|---|---|---|
| JP | H10247536 | 9/1998 |
| JP | 2002075567 | 3/2002 |
| JP | 2006264527 | 10/2006 |

* cited by examiner

INTERPOSER FOR SEMICONDUCTOR-BASED SINGLE PHOTON EMISSION COMPUTED TOMOGRAPHY DETECTOR

BACKGROUND

The present embodiments relate to semiconductor detectors for single photon emission computed tomography (SPECT). Current detectors are tested before attachment to electronics. The only tests are pre-contact attachment, which manufacturers of semiconductor detectors use as a basis to qualify detectors for use in different applications. Carrier boards with connectors are attached to detectors without confirmation whether the detectors have additional problems caused by intermediary steps or in interaction with the carrier and electronics. This is not an issue today, since test fixtures used to qualify detectors have connectors and the cost of replacing these detectors is not significant—even if problems exist.

A more severe issue occurs when the package is fully integrated, such that the detector and an application specific integrated circuit (ASIC) are assembled into a compact and indivisible unit. The semiconductor detectors are not tested post-contact attachment when using direct-attachment technology. There is no confirmation that the detector is performing as required post attachment. If not operating correctly, the entire assembly, including the ASIC, must be discarded.

SUMMARY

By way of introduction, the preferred embodiments described below include methods and systems for testing or production of a semiconductor-based detector in SPECT. An interposer, such as elastomeric device with conductors, is sandwiched between a carrier and the semiconductor detector. The conductors allow for temporary separate connections of detector electrodes to signal processing circuitry, providing for testing of the detector operating with the signal processing circuitry. The interposer provides separate electrical connections for testing but may also be used in a final, fully integrated detector for use in a SPECT system.

In a first aspect, a SPECT detector system includes a SPECT detector, which is a semi-conductor with first conductors exposed on a first detector surface. A carrier has an attached signal processing circuit and second conductors exposed on a first carrier surface. An interposer is between the first surface of the SPECT detector and the second surface of the carrier. The interposer has third conductors extending between first and second interposer surfaces. The third conductors electrically connect the first conductors with the second conductors in separate electrical paths for separate detection cells of the SPECT detector.

In one embodiment, the SPECT detector is a pixelated detector where the first conductors are electrically isolated electrodes for the separate detection cells. The carrier is a printed circuit board. The signal processing circuit is an application specific integrated circuit.

In another embodiment, the interposer is in asperity contact free of bonding with the SPECT detector. For example, the carrier is in a test rig with the SPECT detector removably stacked with the interposer on the carrier in a testing arrangement. In another embodiment, the SPECT detector is bonded to the interposer, and the interposer is bonded to the carrier.

In yet another embodiment, the interposer is an array of the third conductors separated by an elastomer.

In other embodiments, the separate electrical paths are a 1-to-1 arrangement of the detection cells to pads on the carrier without shorting between any of the detection cells. A standard interposer or elastomeric device may be used by providing a mask on the first interposer surface. The mask exposes the third conductors for the 1-to-1 arrangement. For example, the mask is a dielectric of electrically insulating strips forming interposer cells exposing the third conductors at a pitch of the detection cells. The electrically insulating strips have a width accommodating a tolerance stack-up.

In some embodiments, the third conductors are curved wires within the interposer. In other embodiments, the third conductors are straight wires within the interposer.

In an embodiment, the interposer is a plate where the first and second interposer surfaces are parallel largest surfaces of the plate.

In a second aspect, a method is provided for testing a semiconductor sensor of a gamma camera. The semiconductor sensor is placed onto an elastomeric-conductor plate in a test rig. The semiconductor sensor is pressed against the elastomeric-conductor plate. The semiconductor sensor is exposed to gamma radiation. Operation of the semiconductor sensor for sensing the gamma radiation is tested using signals from a detector circuit electrically connected to the semiconductor sensor through elastomeric-conductor plate.

In one embodiment, pressing forms pixelated electrical paths from detector cell electrodes of the semiconductor sensor to pads of a printed circuit board attached to the detector circuit. Detection from the individual detector cells is tested.

The operation of the semiconductor sensor, the detector circuit, and a printed circuit board together are tested. The printed circuit board physically connects to the detector circuit, but the semiconductor sensor may be disconnected. For example, the testing is performed without the semiconductor sensor being bonded to the elastomeric-conductor plate.

In a third aspect, a SPECT system includes a housing forming a patient region and a gamma camera adjacent the patient region. The gamma camera is a semiconductor detector, a carrier having an attached signal processing circuit, and an elastomeric device in direct contact with and between the carrier and the semiconductor detector. The elastomeric device has electrically isolated conductors electrically connecting electrodes of the semiconductor detector to pads of the carrier.

In one embodiment, the carrier is a printed circuit board, the signal processing circuit is an application specific integrated circuit, and the elastomeric device has a dielectric mask exposing the electrically isolated conductors on a surface of the elastomeric device.

In another embodiment, the semiconductor, carrier, and elastomeric device are pressed together without bonding. In other embodiments, the semiconductor detector is a pixelated detector of detection cells with separate ones of the electrodes for separate ones of the detection cells. The pads of the carrier connect with electrically isolated traces to separate inputs of the signal processing circuit, and the elastomeric device is a plate of the isolated conductors and elastomeric material.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE DRAWINGS AND PRESENTLY PREFERRED EMBODIMENTS

A multi-module post-contact test fixture is provided for pixelated semiconductor detectors. Ultra-high performance next generation of SPECT systems will be based on semiconductor pixelated detectors using direct-attachment technology. The semiconductor detectors attach directly into the same PCB substrate where the ASIC is located to minimize trace lengths and parasitic capacitances, thus improving spectral performance beyond what is possibly achievable using connectors and multiple carrier and interposer boards stacked vertically. For testing, the direct contact between the carrier with the pre-attached ASIC to the sensor is through the interposer or a post-contact attachment. The interposer with pixelated electrical paths can be used as a test fixture to validate and/or sort sensors of different grades pre-attachment of the sensor to the carrier and/or to attach the sensor to the carrier (i.e., replace the sensor attachment step) in a production and commercial setting.

Figure 1:
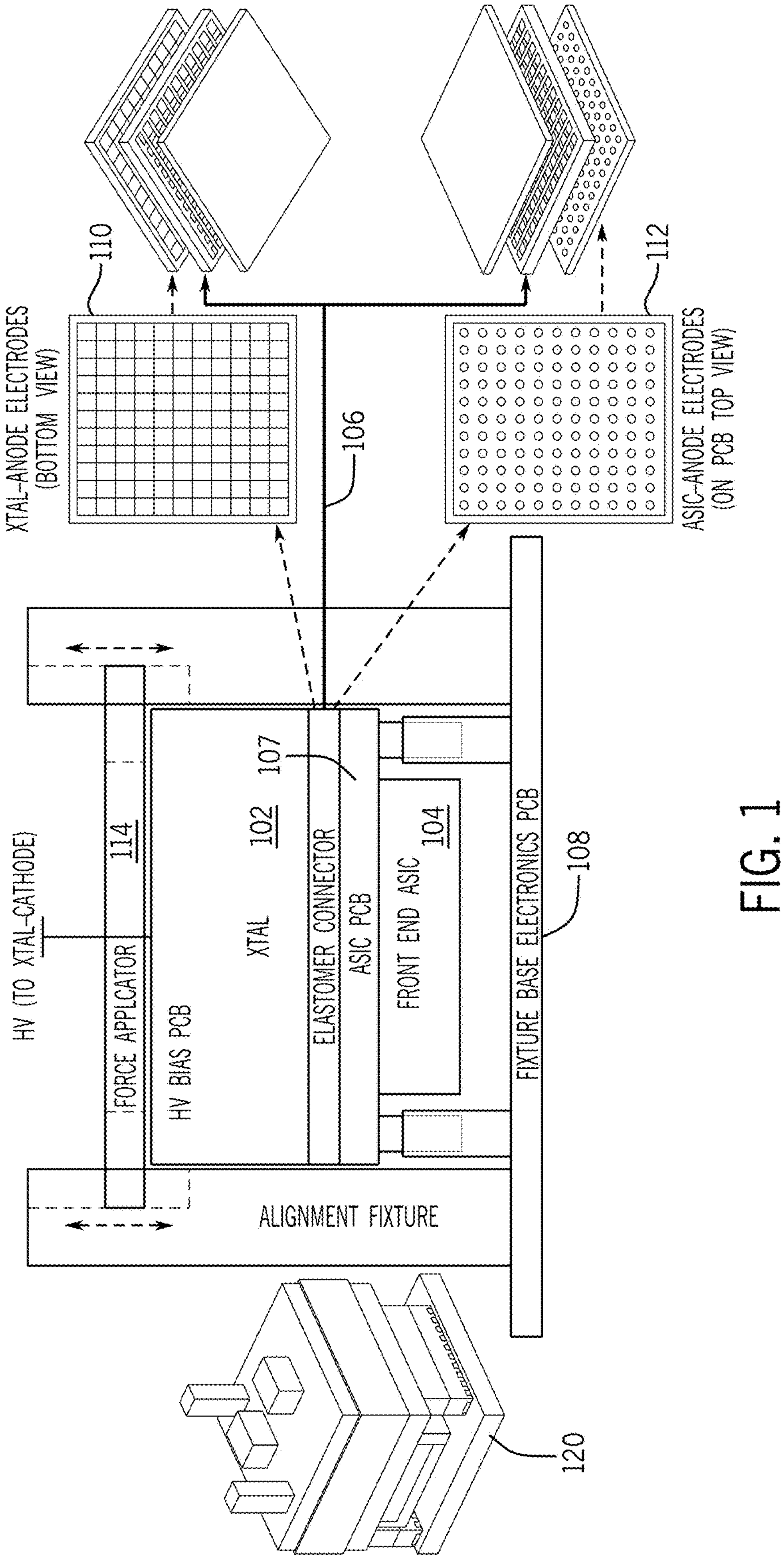
FIG. 1 illustrates one embodiment of a SPECT detector assembly, such as for testing.

FIG. 1 shows one embodiment of a SPECT detector system 120. The SPECT detector system 120 is used for testing a semiconductor detector 102, such as after initial tests and just before forming a production detector for use as a gamma camera in a SPECT imaging system. Alternatively, the SPECT detector system 120 is used as a production detector as assembled in a SPECT imaging system.

The SPECT detector system 120 includes a SPECT detector 102, an interposer 106, and a carrier 107 with a signal processing circuit 104. This stack of detector 102, interposer 106, and carrier 107 may be positioned in a frame, such as between a base (e.g., printed circuit board for electronics or signal routing) 108 and a force applicator 114 (e.g., pressure plate). Other frames may be used. Additional, different, or fewer components may be provided, such as just having the stack of detector 102, interposer 106, and carrier 107.

The SPECT detector 102 is a semiconductor. The detector 102 is a solid-state detector. Any material may be used, such as SI, CZT, CdTe, and/or other material. The SPECT detector 102 is created with wafer fabrication at any thickness, such as about 4 mm for CZT. Any size may be used, such as about 5×5 cm. FIG. 1 shows a square shape for the detector 102. Other shapes than square may be used, such as rectangular or hexagonal.

The SPECT detector 102 is designed and configured to detect gamma emissions, such as emissions from a patient. For example, the semiconductor is formed as an array of silicon photon multiplier cells.

The SPECT detector 102 is a pixelated detector. The SPECT detector 102 forms an array of sensors. For example, the 2.5×2.5 cm or 5×5 cm detector 102 is a 11×11 or 21×21 pixel array of detection cells with a pixel pitch of about 2.2 mm. Each detection cell of the array may separately detect an emission event. Other numbers of pixels, pixel pitch, and/or size of arrays may be used. Other grids than rectangular may be used, such as a hexagonal distribution of pixels or detection cells.

Anode and cathode electrodes are provided on opposite surfaces of the detector 102. In the example herein, the lower voltage (e.g., 10 volts or less) anode electrodes 110 are used. The same or similar arrangement may be used for cathode electrodes, such as connecting the cathode electrodes through an interposer to a carrier for a high voltage processing circuit. Wires or flex circuit with traces may be used for signal routing from cathode electrodes where a common processing circuit 104 operates on both anode and cathode signals.

The anode electrodes 110 are conductors exposed on a surface of the detector 102. The electrodes 110 have a same pitch as the detection cells and are electrically isolated from each other for separate connections to the detection cells of the detector 102.

The carrier 107 is a printed circuit board or other material for electrical and physical connection with the signal processing circuit 104. In alternative embodiments, the signal processing circuit 104 is the carrier 107, such as being a semiconductor chip with exposed pads or electrodes.

The carrier 107 has the signal processing circuit 104 on one side and exposed conductors 112 on the other side. Deposited traces or wires within the carrier 107 route from the conductors 112 to the signal processing circuit 104. The conductors 112 are electrodes, pads, or other electrically conducting material for receiving signals from the anode electrodes 110 of the detector 102.

The signal processing circuit 104 is an analog, digital, or both analog and digital circuit. Wires route between devices to filter, amplify, determine timing, determine energy, and/or otherwise process received signals from the detection cells of the detector 102. In one embodiment, the signal processing circuit 104 is an application specific integrated circuit (ASIC). The ASIC is formatted for processing. A plurality of ASICs may be provided, such as 9 ASICS in a 3×3 grid of the detector 102.

The signal processing circuit 104 connects to the carrier 107. The connection may be by soldering, ball grid array, or bump soldering. Flip chip or other chip to carrier 107 connection may be used.

Figure 2:
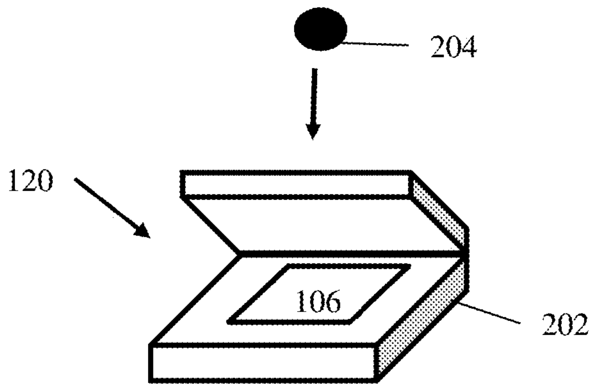
FIG. 2 illustrates an example testing rig using an interposer.

In one embodiment, the carrier 107 is fixed in or part of a test rig. The SPECT detector system 120 is a test rig, as represented in FIG. 1 or 2. The SPECT detector 102 is removably stacked with the interposer 106 on the carrier 107. The interposer 106 may be fixed to the carrier 107 or may also be removable. The fixation is with a latch, bolt, clamp, bonding, soldering, or other attachment to prevent movement when aligning the detector 102. The test fixture or rig is provided in a factory or processing facility for testing the SPECT detector 102 prior to attachment of the SPECT detector 102 in a production arrangement with a carrier.

The test rig may test individual SPECT detectors 102 one at a time, such as represented in FIG. 1. Alternatively, the test rig may accept multiple SPECT detectors 102 for simultaneous but separate testing. In the example of FIG. 2, the test rig 202 is closed to press the detector 102 against the interposer 106, forming asperity contact electrical connections of the electrodes 110 with the interposer 106. In the example of FIG. 1, a manual or other force presses the plate 114 against the detector 102.

For testing, the pressed arrangement of the detector 102, interposer 106, and carrier 107 is exposed to one or more sources 204 of radiation. For example, the test rig is in a shielded cabinet. The cabinet is sealed after placing the detector 102 in the test rig. Once sealed, a cartridge of selectable sources 204 is positioned so that radiation from a selected source 204 may pass through an aperture to the SPECT detector system 120. The operation of the SPECT detector 102 in conjunction with the carrier 107 and signal processing circuit 104 is tested, such as by measuring the signals generated by the signal processing circuit 104. The operation of the stack is tested. Individual detection cells may be tested.

In an alternative embodiment, the SPECT detector system 120 is part of a production assembly. For example, the detector 102 is bonded to the interposer 106, which is bonded to the carrier 107. As another example, the force applicator 114 is fixed in place, using pressure to hold the stack together. By avoiding bonding in forming the direct attachments, defective components of the stack may be individually removed by removing the force applicator 114. The assembled SPECT detector system 120 is fixed in a SPECT imager for use as part of a gamma camera for scanning patients.

The interposer 106 is shaped and sized for stacking. The interposer 106 is stacked between the surface of the detector 102 with the exposed anode electrodes 110 and the surface of the carrier 107 with the exposed conductors 112. The interposer 106 is a plate with opposing, parallel largest surfaces for contacting the detector 102 and the carrier 107. The interposer 106 is thin, such as being 0.10-0.20 inches thick. The interposer 106 has a same largest surface size and shape as the detector 102, such as 2.5×2.5 or 5×5 cm. The largest surfaces of the interposer 106 may be smaller, larger, and/or have a different shape than the surface of the detector 102 with the exposed electrodes 110.

The right side of FIG. 1 shows the stack of the detector 102, interposer 106, and carrier 107 from two perspectives with space between the components. The space is provided to show the electrodes 110 or 112 and exposed conductors 302 of the interposer 106. When stacked, no space is provided between the detector 102, interposer 106, and carrier 107, such as forming asperity contact for electrical connections.

The interposer 106 is formed from electrically insulating material with an array of conductors 302 interspersed or held in the insulating material. For example, the interposer 106 is an elastomer, such as formed from silicone, around the conductors 302.

The conductors 302 extend from one opposing surface to another opposing surface of the interposer 106. The conductors 302 are electrically isolated from each other. The conductors 302 are wires but traces or other conducting material may be used.

Figure 3:
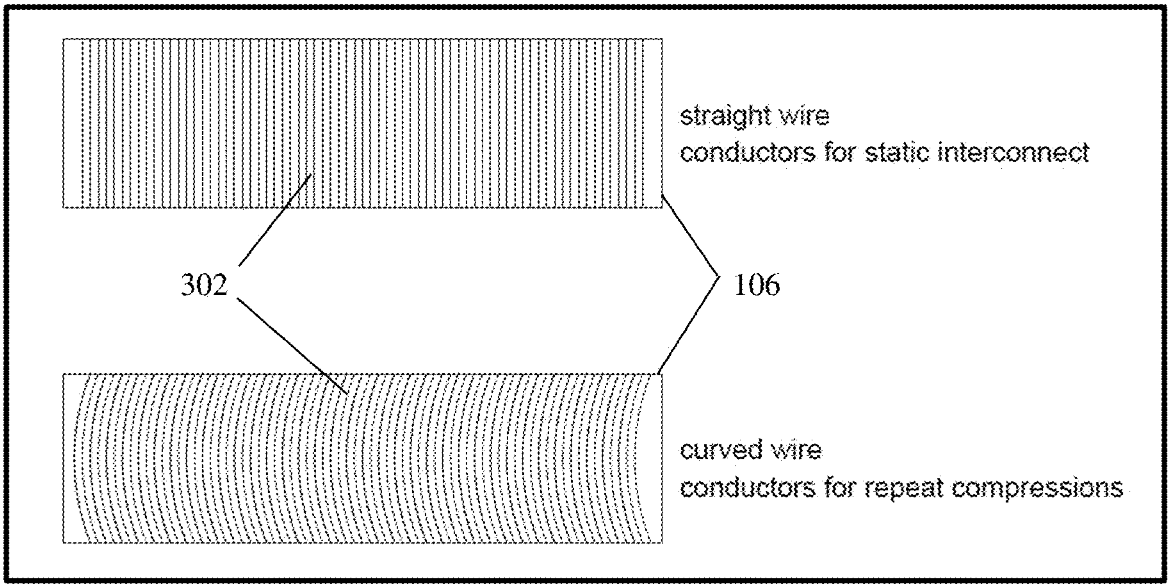
FIG. 3 shows different example wire shapes in the interposer.

The conductors 302 are straight or curved. FIG. 3 shows an example. Straight wires are used for a static interconnection, such as in a production SPECT detector system 120. The interposer 106 with straight wires as the conductors 302 replaces bonded or permanent attachment. Curved wires are used for repeat compressions, such as for use in a testing rig. The curved wires may be curved in a single radius of a single plane. In other embodiments, the curved wires are springs (e.g., helical) or have different curvature at different portions.

The interposer 106 has the conductors 302 exposed on opposing surfaces for mating with the electrodes 110 and conductors 112 of the detector 102 and the carrier 107, respectively. The exposed conductors 302 allow for asperity contact free of bonding to create electrical paths from the detector 102 to the carrier 107 and signal processing circuit 104. Pressure fitting without bonding may be used. Bonding is used in other embodiments.

Figure 4:
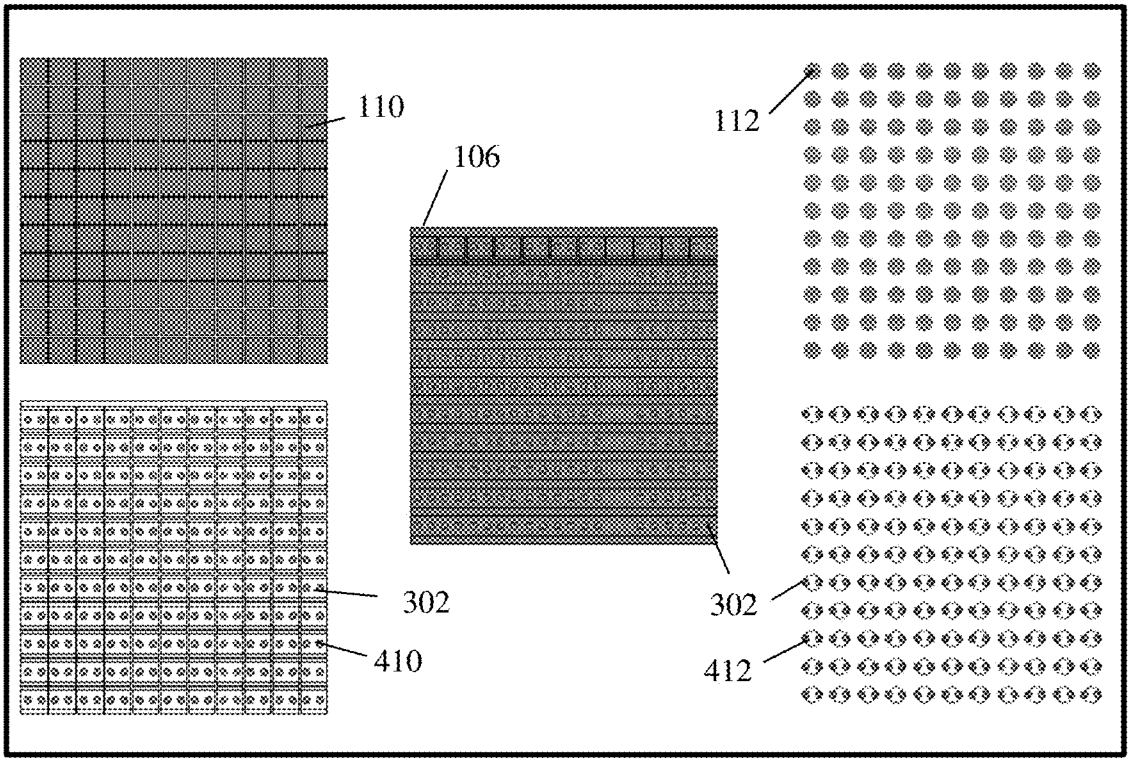
FIG. 4 illustrates example electrical path connections.

The conductors 302 are arranged to have a same or matching pitch as the electrodes 110 and the conductors 112 to form separate electrical paths for the separate detection cells to the signal processing circuit 104. A single conductor 302 or two or more conductors 302 are provided for each of the separate electrical paths. FIG. 4 shows an example where two conductors 302 (small circles 410, 412) are provided for each electrode 110 (small squares) and respective conductor 112 pad (larger circles). The bottom row of FIG. 4 shows the electrodes 110 or pads 112 with overlaid conductors 302.

Each path is electrically isolated from the other paths. When stacked, the detector 102, interposer 106, and carrier 107 are aligned so that shorting does not occur. The conductors 302 are arranged so that multiple electrodes 110 do not connect to one conductor 112 and so that multiple conductors 112 do not connect to one electrode 110. In other embodiments, cross-connection is provided for one or more conductors 112 and/or electrodes 110.

The separate paths form a 1-to-1 arrangement of the detection cells (e.g., electrodes 110) to pads (conductors 112) on the carrier 107 without shorting between any of the detection cells. A fine array of contacts and corresponding conductors 302 (410, 412) are positioned in 1-1 relationship between the sensor contacts (e.g., electrodes 110) on one side and the ASIC carrier pads (e.g., conductors 112) on the opposite side. The interposer 106 thus replaces the need of permanent attachment between the detector 102 and the carrier 107. The conductors 302 in this arrangement electrically contact the ASIC inputs to the sensor electrodes 110.

The interposer 106 is custom-made, where the size of the conductors 302 as well as the pitch and positioning of the conductors 302 are controlled to establish electrically isolated paths and avoid shorting between neighbor detection cells. A conductive/non-conductive combination in an elastomeric device enables a 1-1 contact between ASIC and sensor.

Figure 5:
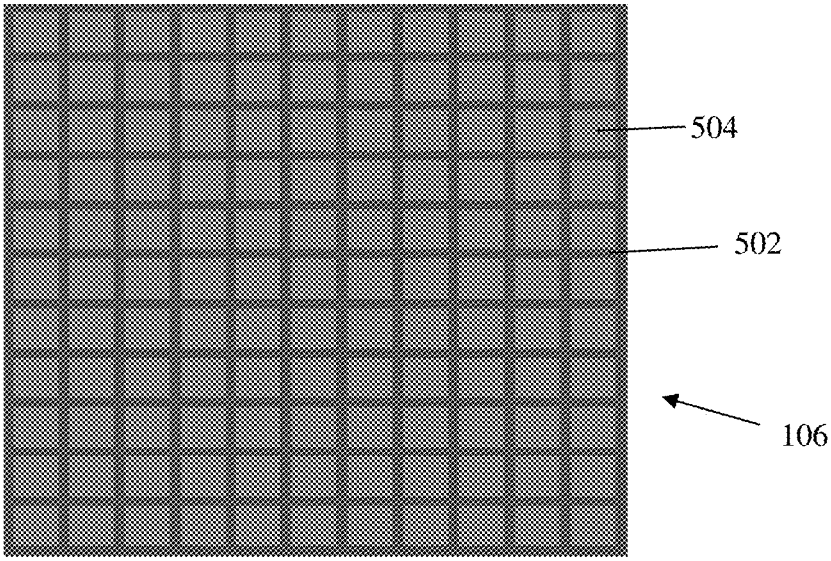
FIG. 5 shows an example mask on an interposer.

FIG. 5 shows an embodiment of the interposer 106 allowing use of an off-the-shelf, standardized, or non-custom arrangement of the conductors 302. A mask 502 is placed over or formed on one or both largest opposing surfaces of the interposer 106. The mask 502 is not electrically conductive (i.e., is insulating). The mask 502 causes electrical separation of the paths, forming the 1-to-1 arrangement. The conductors 302 are exposed through gaps or holes 504 in the mask 502, or the mask 502 includes conductive portions between the insulating strips to form the separate electrical paths. The inter-pixel street mask 502 matches 1-to-1 with the electrodes 110 and conductors 112, without shorting signals.

In one embodiment, the mask 502 is formed from a crosshatch pattern of strips or as a grid. Other arrangements, such as a sheet with circular or other shaped holes for exposing conductors 302, may be used. The exposed portion has a same size and/or pitch as the electrodes 110 and/or conductors 112. The width of the strips or insulating portion accommodates a tolerance stack-up. The width of the strips of the inter-pixel street mask 502 is chosen to accommodate tolerance stack-ups, such as two or more of mask registration, mask tolerance, pixel/street tolerance, and/or another tolerance. The width is selected to avoid shorting.

The mask 502 is thin to allow asperity contact under application of pressure or force. In one embodiment, the thin, anode inter-pixel street mask 502 is a dielectric of electrically insulating strips forming interposer cells 504 exposing the third conductors 302 at a pitch of the detection cells. Any thickness may be used, such as thin dielectric epoxy-glass resin with thicknesses of 75 μm, 120 μm and 190 μm.

In one embodiment, the mask 502 is screened and cured onto the interposer 106 in two steps (H/V). The mask 502 may be spun onto the interposer 106, imaged, and selectively removed (photolithography). The mask may be molded into the interposer using a die that forms recessed channels within the interposer (embedded mask). The mask may be applied directly on to the solid state detector (street passivation) using an imaged resist and evaporated thin film of aluminum oxide.

The interposer 106 allows for easy disassembly while still providing short conductive paths. Direct attachment is provided with the additional interposer 106, allowing minimal trace lengths and limiting parasitic capacitance. The same test rig may be used to sequentially test different SPECT detectors 102. After removing the detectors 102, the interposer 106 may be placed between the detector circuit ASIC board 107 and a test head/board to simultaneously test detector circuit/ASIC inputs. The testing tests using signal processing by the signal processing circuit 104, so may be more comprehensive and may test individual detection cells. The testing may be performed as part of or just before assembly. The interposer 106 may be placed between the solid-state sensor 102 and any testing head/fixture/device, other than the ASIC substrate 107, for testing the solid state sensor 102. Other testing arrangements may be used.

Figure 6:
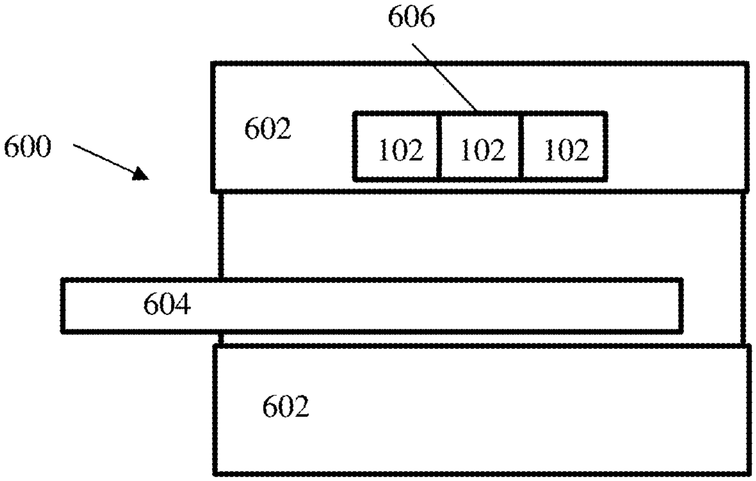
FIG. 6 is cross-section view of a SPECT imager or system.

FIG. 6 shows the SPECT detector system 120 used in a SPECT system or imager 600. The SPECT detector system 120 is used as a gamma camera 606 or part of the gamma camera 606 in the SPECT system 600.

The SPECT system 600 is an imaging system for imaging a patient on the bed 604. The gamma camera 606 formed by the SPECT detector system 120 (e.g., detector 102, interposer 106, and carrier 107 with signal processing circuit 104) detects emissions from the patient.

The SPECT system 600 includes a housing 602. The housing 602 is metal, plastic, fiberglass, carbon (e.g., carbon fiber), and/or other material. In one embodiment, different parts of the housing 602 are of different materials.

The housing 602 forms a patient region into which the patient is positioned for imaging. The bed 604 may move the patient within the patient region to scan different parts of the patient at different times. Alternatively, or additionally, a gantry holding the SPECT detector system 120 moves the detector 102.

The gamma camera 606 is adjacent the patient region. The gamma camera 606 includes one or more semiconductor detectors 102, such as pixelated detectors with detection cells where separate electrodes are provided for the separate detection cells. The carrier 107, such as a printed circuit board, is the same or different one than used for testing. The carrier 107 includes pads that electrically connect with electrically isolated traces to separate inputs of the attached signal processing circuit 104. The elastomeric device (i.e., interposer 106) is in direct contact with and between the carrier 107 and the semiconductor detector 102. The elastomeric device is a plate of electrically isolated conductors 302 and elastomeric material. The conductors 302 electrically connect the electrodes 110 of the semiconductor detector 102 to pads 112 of the carrier 107. In some embodiments, a dielectric mask 502 is used to expose the electrically isolated conductors 302 on a surface of the elastomeric device.

The semiconductor detector 102, carrier 107, and elastomeric device are pressed together without bonding. This press fitting for direct electrical attachment is provided for the SPECT detector system 120 for use in imaging a patient. The force fit may be released to gain access to a broken component. Alternatively, the SPECT detector system 120 is a bonded unit where the various components are bonded to each other.

Figure 7:
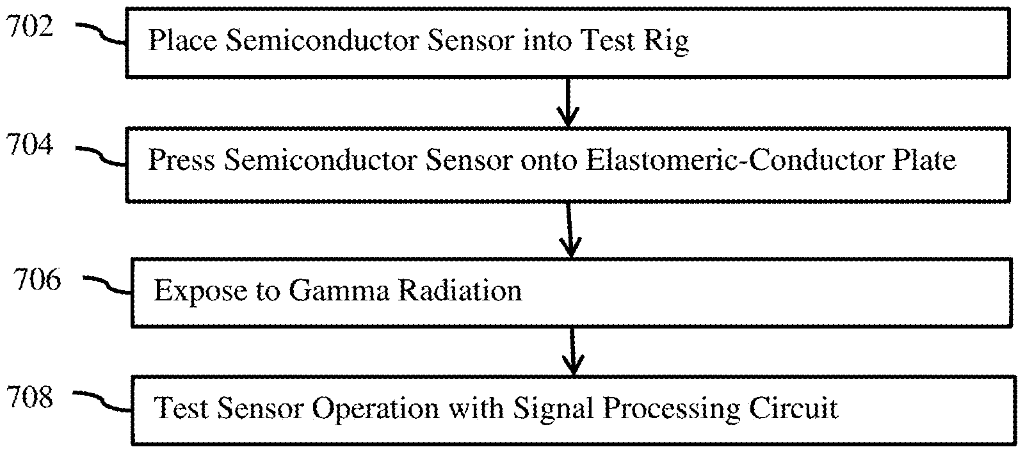
FIG. 7 is a flow chart diagram of an example embodiment of a method for testing a semiconductor detector for SPECT use.

FIG. 7 shows one embodiment of a method for testing a semiconductor sensor of a gamma camera. An elastomeric-conductor plate is positioned between a semiconductor sensor and carrier. The elastomeric-conductor plate allows for the semiconductor sensor to be tested for operation with signal processing, which also allows for testing individual detector cells and/or for imaging.

The method is implemented by the system of FIG. 1, FIG. 2, or another system. A test rig or fixture is used for testing. An emission source emits rays to the press-fitted semiconductor sensor in the test rig. The signal processing circuit tests operation (i.e., detection of the emissions from the source) or is used for the testing, such as examining data output by the signal processing circuit. Other systems, semiconductor sensors, elastomeric-conductive plates, and/or carriers may be used.

The acts are performed in the order shown (i.e., top to bottom or numerically) or other orders. Additional, different, or fewer acts may be provided. For example, an act for placing the elastomeric-conductive plate into the test fixture is provided. As another example, acts for sealing a cabinet, selecting the source, and/or positioning the source are provided.

In act 702, the semiconductor sensor is placed onto an elastomeric-conductor plate in a test rig. The elastomeric-conductive plate is fixed in the test rig or may be removable, such as also being placed onto the carrier. The elastomeric-conductive plate and/or the semiconductor sensor are placed in the test rig. The placement may use alignment pins to align relative to the elastomeric-conductive plate and/or the carrier. The stack is formed.

In act 704, the semiconductor sensor is pressed against the elastomeric-conductor plate. After stacking the semiconductor sensor with the elastomeric-conductive plate and the carrier, the stack is pressed together. A plate or press may be lowered or rotated to contact the stack. Pressure is then applied and maintained. The pressure may be manual, hydraulic, or pneumatic. The pressure may be regulated to avoid over-pressure.

The pressure forms asperity contacts between conductors of the semiconductor sensor, the elastomeric-conductive plate, and the carrier. Pixelated electrical paths are formed from detector cell electrodes of the semiconductor sensor to pads of a printed circuit board attached to the detector circuit. The electrical paths extend through the elastomeric-conductive plate and are electrically isolated from each other, allowing individual sensor cell testing.

In act 706, the semiconductor sensor is exposed to gamma radiation. Once pressed together, the test fixture, including the semiconductor sensor, is positioned for detection. A gamma source may be positioned to emit gamma rays to the semiconductor sensor. An aperture may be opened, or the source may be placed by an aperture so that rays may pass from the source to the semiconductor sensor.

In act 708, operation of the semiconductor sensor is tested. The operation to sense the gamma rays or emissions from the source is tested. The semiconductor sensor generates electrical signals in response to detection of an emission. The sensing may be cell-by-cell so that one cell detects a given emission and another does not.

The signals from the semiconductor signal pass through the elastomeric-conductive plate to the carrier, which routes the signals to the detector circuit (e.g., ASIC). The separate electrical paths to the detector circuit allows for testing of individual detector cells of the semiconductor sensor.

By using signals processed by the detector circuit, the testing is of operation of the semiconductor sensor, the detector circuit, and a printed circuit board together. The printed circuit board physically connects to the detector circuit, which outputs information based on the signals from the semiconductor sensor responsive to emissions from the source.

The stack is tested but without the semiconductor sensor being bonded to the elastomeric-conductor plate. The elastomeric-conductive plate allows for testing the stack while also allowing removal of the semiconductor sensor.

Different semiconductor sensors are tested. Based on performance, including by individual cells, the semiconductor sensors are graded and assign to specific SPECT imaging systems. Once assigned, the semiconductor sensors are stacked with the carriers with or without intervening elastomeric-conductive plates, forming the gamma camera. The gamma camera may then be used to image a patient.

While the invention has been described above by reference to various embodiments, many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. A single photon emission computed tomography (SPECT) detector system comprising:

a SPECT detector comprising a semi-conductor with first conductors exposed on a first detector surface;

a carrier having an attached signal processing circuit, the carrier having second conductors exposed on a first carrier surface; and an interposer between the first surface of the SPECT detector and the second surface of the carrier, the interposer having third conductors extending between first and second interposer surfaces, the third conductors electrically connecting the first conductors with the second conductors in separate electrical paths for separate detection cells of the SPECT detector, wherein the interposer is in asperity contact free of bonding with the SPECT detector;

wherein the carrier is in a test rig with the SPECT detector removably stacked with the interposer on the carrier in a testing arrangement.

2. The SPECT detector system of claim 1 wherein the SPECT detector comprises a pixelated detector where the first conductors are electrically isolated electrodes for the separate detection cells, the carrier comprises a printed circuit board, and the signal processing circuit comprises an application specific integrated circuit.

3. The SPECT detector system of claim 1 wherein the interposer comprises an array of the third conductors separated by an elastomer.

4. The SPECT detector system of claim 1 wherein the separate electrical paths comprise 1-to-1 arrangement of the detection cells to pads on the carrier without shorting between any of the detection cells.

5. The SPECT detector system of claim 4 wherein the interposer comprises a mask on the first interposer surface, the mask exposing the third conductors for the 1-to-1 arrangement.

6. The SPECT detector system of claim 5 wherein the mask comprises a dielectric of electrically insulating strips forming interposer cells exposing the third conductors at a pitch of the detection cells, the electrically insulating strips having a width accommodating a tolerance stack-up.

7. The SPECT detector system of claim 1 wherein the third conductors comprise curved wires within the interposer.

8. The SPECT detector system of claim 1 wherein the third conductors comprise straight wires within the interposer.

9. The SPECT detector system of claim 1 wherein the interposer comprises a plate where the first and second interposer surfaces are parallel largest surfaces of the plate.

10. The SPECT detector system of claim 1 wherein the SPECT detector is bonded to the interposer, and the interposer is bonded to the carrier.

11. A method for testing a semiconductor sensor of a gamma camera, the method comprising:

placing the semiconductor sensor onto an elastomeric-conductor plate in a test rig;

pressing the semiconductor sensor against the elastomeric-conductor plate;

exposing the semiconductor sensor to gamma radiation; and testing operation of the semiconductor sensor for sensing the gamma radiation using signals from a detector circuit electrically connected to the semiconductor sensor through the elastomeric-conductor plate.

12. The method of claim 11 wherein pressing comprises forming pixelated electrical paths from detector cell electrodes of the semiconductor sensor to pads of a printed circuit board attached to the detector circuit, and wherein testing comprises testing detection from the individual detector cells.

13. The method of claim 11 wherein testing comprises testing the operation of the semiconductor sensor, the detector circuit, and a printed circuit board together, the printed circuit board physically connected to the detector circuit.

14. The method of claim 13 wherein testing comprises testing without the semiconductor sensor being bonded to the elastomeric-conductor plate.

15. The method of claim 13 further comprising removing the semiconductor sensor and testing operation of the detector circuit with a test board stacked with the elastomeric-conductor plate and the detector circuit.

16. A single photon emission computed tomography (SPECT) system comprising:

a housing forming a patient region; and a gamma camera adjacent the patient region, the gamma camera comprising a semiconductor detector having separate detection cells, a carrier having an attached signal processing circuit, and an elastomeric device in direct contact with and between the carrier and the semiconductor detector, the elastomeric device having electrically isolated conductors electrically connecting electrodes of the separate detection cells of the semiconductor detector to pads of the carrier in a 1-to-1 arrangement without shorting between any of the detection cells;

wherein the elastomeric device comprises a mask on a surface of the elastomeric device, the mask comprising a dielectric of electrically insulating strips forming cells exposing the electrically isolated conductors at a pitch of the detection cells, the electrically insulating strips having a width accommodating a tolerance stack-up.

17. The SPECT system of claim 16 wherein the carrier comprises a printed circuit board, the signal processing circuit comprises an application specific integrated circuit, and the elastomeric device has a dielectric mask exposing the electrically isolated conductors on a surface of the elastomeric device.

18. The SPECT system of claim 16 wherein the semiconductor, carrier, and elastomeric device are pressed together without bonding.

19. The SPECT system of claim 16 wherein the semiconductor detector comprises a pixelated detector of detection cells with separate ones of the electrodes for separate ones of the detection cells, wherein the pads of the carrier connect with electrically isolated traces to separate inputs of the signal processing circuit, and wherein the elastomeric device comprises a plate of the isolated conductors and elastomeric material.

* * * * *